(12) United States Patent
Qian et al.

(10) Patent No.: US 9,893,310 B2
(45) Date of Patent: *Feb. 13, 2018

(54) OLED PACKAGE STRUCTURE AND PACKAGING METHOD

(71) Applicant: Shenzhen China Star Optoelectronics Technology Co., Ltd., Shenzhen, Guangdong (CN)

(72) Inventors: Jiajia Qian, Guangdong (CN); Yifan Wang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 125 days.

This patent is subject to a terminal disclaimer.

(21) Appl. No.: 14/429,348

(22) PCT Filed: Feb. 9, 2015

(86) PCT No.: PCT/CN2015/072598
§ 371 (c)(1),
(2) Date: Mar. 18, 2015

(87) PCT Pub. No.: WO2016/101403
PCT Pub. Date: Jun. 30, 2016

(65) Prior Publication Data
US 2016/0343978 A1    Nov. 24, 2016

(30) Foreign Application Priority Data

Dec. 26, 2014    (CN) .......................... 2014 1 0833403

(51) Int. Cl.
*H01L 51/52*    (2006.01)
*H01L 51/56*    (2006.01)
*H01L 27/32*    (2006.01)

(52) U.S. Cl.
CPC ...... *H01L 51/5246* (2013.01); *H01L 27/3244* (2013.01); *H01L 51/5253* (2013.01); *H01L 51/56* (2013.01); *H01L 2227/323* (2013.01)

(58) Field of Classification Search
CPC ............. H01L 51/5246; H01L 27/3244; H01L 51/5253; H01L 51/56; H01L 51/50; H01L 2227/323
See application file for complete search history.

(56) References Cited

U.S. PATENT DOCUMENTS 6,624,572 B1 *   9/2003   Kim ....................... G06Q 40/02
                                                       313/500
6,628,071 B1 *   9/2003   Su ....................... H01L 51/5246
                                                       313/504

(Continued)

FOREIGN PATENT DOCUMENTS

CN    102701591 A    10/2012
CN    104157799 A    11/2014
CN    203983341 U    12/2014

*Primary Examiner* — Tom Thomas
*Assistant Examiner* — Vincent Wall
(74) *Attorney, Agent, or Firm* — Andrew C. Cheng

(57) ABSTRACT

The present invention provides an OLED package structure and a packaging method. The structure includes a substrate (1), a package lid (2) opposite to the substrate (1), an OLED device (12) located between the substrate (1) and the package lid (2) and mounted on the substrate (1), a solid resin film (22) located between the substrate (1) and the package lid (2) and arranged on the package lid (2) to completely cover the OLED device (12), an inorganic protective frame (11) arranged on the substrate (1) and located outside an outer circumference of the solid resin film (22), adhesive (23) applied on the package lid (2) to bond the inorganic protective frame (11) and the package lid (2) to each other, and fritted glass (21) arranged outside an outer circumference of the inorganic protective frame (11) to bond the (Continued)

substrate (1) and the package lid (2) to each other. The present invention provides an arrangement where the inorganic protective frame is arranged inboard the fritted glass to effectively strengthen air tightness achieved with the fritted glass. Further, the solid resin film is arranged on the package lid to cover the OLED device so as to further strengthen the capability of the OLED package structure for blocking moisture and also, a gap in the interior of the sealed object is lessened so as to provide a sufficient mechanical strength to extend the lifespan of the OLED device.

5 Claims, 5 Drawing Sheets

(56) References Cited

U.S. PATENT DOCUMENTS

| | | | | |
|---|---|---|---|---|
| 6,636,192 | B1* | 10/2003 | Saitoh | G02F 1/1339 345/87 |
| 7,193,364 | B2* | 3/2007 | Klausmann | H01L 51/5259 313/504 |
| 7,479,735 | B2* | 1/2009 | Kum | H01L 51/524 313/504 |
| 7,911,138 | B2* | 3/2011 | Kim | B65D 75/36 313/504 |
| 8,264,143 | B2* | 9/2012 | Bae | H01L 51/5246 313/504 |
| 9,054,326 | B2* | 6/2015 | Hu | H01L 51/448 |
| 2002/0155320 | A1* | 10/2002 | Park | H05B 33/04 428/690 |
| 2005/0110389 | A1* | 5/2005 | Kijima | H01J 29/028 313/495 |
| 2006/0022592 | A1* | 2/2006 | Boroson | H01L 51/524 313/512 |
| 2006/0028128 | A1* | 2/2006 | Ohkubo | H01L 51/5253 313/506 |
| 2007/0172971 | A1* | 7/2007 | Boroson | H01L 51/5246 438/26 |
| 2009/0064717 | A1* | 3/2009 | Son | C03C 8/04 65/42 |
| 2012/0112212 | A1* | 5/2012 | Kim | H01L 51/5246 257/88 |
| 2012/0169229 | A1* | 7/2012 | You | H01L 27/3244 315/51 |
| 2012/0262058 | A1* | 10/2012 | Park | H01L 51/524 313/512 |
| 2013/0307407 | A1* | 11/2013 | Wang | H05B 33/04 313/512 |
| 2014/0232258 | A1* | 8/2014 | Oh | H01L 51/5246 313/504 |
| 2015/0185142 | A1* | 7/2015 | Zeng | H01L 51/5259 257/40 |
| 2016/0248037 | A1* | 8/2016 | Liu | H01L 51/5259 |
| 2016/0248042 | A1* | 8/2016 | Qian | H01L 51/56 |

* cited by examiner

OLED PACKAGE STRUCTURE AND PACKAGING METHOD

BACKGROUND OF THE INVENTION

1. Field of the Invention

The present invention relates to the field of packaging technology, and in particular to an OLED (Organic Light-Emitting Diode) package structure and a packaging method.

2. The Related Arts

OLED stands for organic light emitting diode, which has various advantages, such as being self-luminous, high brightness, wide view angle, high contrast, being flexible, and low power consumption and is considered the new generation of display measures that gradually takes the place of the conventional liquid crystal displays by being widely used in mobile phone screens, computer displays, and full-color televisions. The OLED displaying technology is different from the liquid crystal displaying technology in that no backlighting is needed and an extremely thin coating layer of an organic material and a glass substrate are used in such a way that when an electrical current flows therethrough, the organic material emits light. However, since the organic material is highly reactive to moisture and oxygen, an OLED display, which is a display device based on such an organic material, must require extremely high standard of packaging.

Most of the organic substances contained in an OLED light emission layer are extremely sensitive to pollutions, oxygen, and moisture contained in the atmosphere. Electrochemical corrosion may readily occur in a humid environment so as to severely affect the lifespan of an OLED device. Interior sealability of an OLED device must be improved by means of device packaging in order to achieve isolation from the outside environment as better as possible. This is of vital importance to the stability of light emission of an OLED device.

Packaging of an OLED device is generally achieved with a frit based laser packaging process as illustrated in FIG. 1. Such a packaging process is carried out by forming a loop of fritted glass 300 around a circumference of a package lid 200, which is then positioned on a substrate 100 on which an OLED device 400 to be packaged is arranged. A laser is then applied to instantaneously heat the fritted glass 300 to melt thereby adhering the two glass sheets together. Frit based laser technology involves an inorganic packaging medium so as to exhibits a strong capability of blocking moisture and oxygen and a device so obtained has an extended lifespan, making it particularly suitable for the OLED technology that is generally sensitive to moisture and oxygen. However, the frit based laser packaging process generally needs the gap of a cavity to be large, making it impossible to provide a sufficient mechanical strength and thus not suitable for OLED display panels of large sizes. Further, thermal radiation occurs when the fritted glass is being molten and this may cause burning of a light emission element.

Thus, it is desired to provide a novel OLED package structure and a packaging method that overcome the above problems.

SUMMARY OF THE INVENTION

An object of the present invention is to provide an OLED package structure, which has an excellent capability of blocking moisture and oxygen and provides an excellent packaging effect and shows a relatively high mechanical strength so as to be suitable for a large-sized OLED display panel.

Another object of the present invention is to provide an OLED packaging method, which involves a simple process, is easy to perform, has an excellent packaging effect, has an excellent capability of blocking moisture and oxygen, and also has a small gap inside a sealed object so as to provide a relatively high mechanical strength and is thus suitable for a large-sized OLED display panel.

To achieve the above objects, the present invention provides an OLED package structure, which comprises a substrate, a package lid opposite to the substrate, an OLED device located between the substrate and the package lid and mounted on the substrate, a solid resin film located between the substrate and the package lid and arranged on the package lid to completely cover the OLED device, an inorganic protective frame arranged on the substrate and located outside an outer circumference of the solid resin film, adhesive applied on the package lid to bond the inorganic protective frame and the package lid to each other, and fritted glass arranged outside an outer circumference of the inorganic protective frame to bond the substrate and the package lid to each other.

The package lid comprises a trough formed therein to correspond in position to the OLED device and the solid resin film is adhesively mounted inside the trough in such a way as to completely cover the OLED device.

The substrate is a thin-film transistor (TFT) substrate and the package lid comprises a glass board or a metal board.

The inorganic protective frame is made of a material comprising silicon nitride.

The adhesive comprises box dam glue.

The present invention also provides an OLED packaging method, which comprises the following steps:

(1) provides providing a substrate 1 to be package and a package lid, wherein the package lid comprises a trough formed therein;

(2) coating a loop of frit along a circumference of the package lid outside the trough and applying high temperature pre-sintering to form fritted glass;

(3) forming a loop of inorganic protective frame on the substrate at a location outside the trough and corresponding an inner side of the fritted glass;

(4) forming an OLED device on an internal location of the substrate corresponding to the trough of the package lid;

(5) adhesively attaching a solid resin film inside the trough of the package lid;

(6) forming a loop of adhesive on the package lid at a location corresponding to the inorganic protective frame;

(7) laminating the substrate and the package lid to each other to have the substrate and the package lid bonded to each other by means of the solid resin film and the adhesive; and (8) applying irradiation of laser to melt the fritted glass so as to have the package lid and the substrate further bonded together to complete packaging of the substrate with the package lid.

The substrate is a TFT substrate and the package lid comprises a glass board or a metal board.

In step (3), the inorganic protective frame is made of a material comprising silicon nitride and the inorganic protective frame has a height smaller than a height of the fritted glass.

The solid resin film has a surface area greater than a surface area of the OLED device so that when the substrate and the package lid are laminated to each other, the solid resin film completely covers the OLED device.

In step (6), the adhesive comprises box dam glue.

The present invention further provides an OLED package structure, which comprises a substrate, a package lid opposite to the substrate, an OLED device located between the substrate and the package lid and mounted on the substrate, a solid resin film located between the substrate and the package lid and arranged on the package lid to completely cover the OLED device, an inorganic protective frame arranged on the substrate and located outside an outer circumference of the solid resin film, adhesive applied on the package lid to bond the inorganic protective frame and the package lid to each other, and fritted glass arranged outside an outer circumference of the inorganic protective frame to bond the substrate and the package lid to each other;

wherein the package lid comprises a trough formed therein to correspond in position to the OLED device and the solid resin film is adhesively mounted inside the trough in such a way as to completely cover the OLED device; and wherein the substrate is a thin-film transistor (TFT) substrate and the package lid comprises a glass board or a metal board.

The efficacy of the present invention is that the present invention provides an OLED package structure, which comprises an inorganic protective frame arranged inboard the fritted glass so as to effectively strengthen air tightness of the fritted glass and a solid resin film arranged on a package lid to cover an OLED device so as to further strengthen the capability of blocking moisture and at the same lessen a gap in the interior of the sealed object thereby improving mechanical strength thereof and extending the lifespan and thus making it suitable to a panel of a large size. The present invention provides an OLED packaging method, in which by arranged an inorganic protective frame on an inner side of and, thus, inboard fritted glass, air tightness achieved with the fritted glass is effectively strengthened. Further, a solid resin film is arranged on a package lid to cover an OLED device so as to further strengthen the capability of blocking moisture. Further, the inorganic protective frame helps isolate radiation heat generated in sintering the fritted glass thereby protecting a light emission element from being burned and also, a gap in the interior of the sealed object is lessened to provide a sufficient mechanical strength and thus effectively extend the lifespan of the OLED device, making it suitable for a panel of a large size and easy to carry out with improved operability.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of an embodiment of the present invention, with reference to the attached drawing.

In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
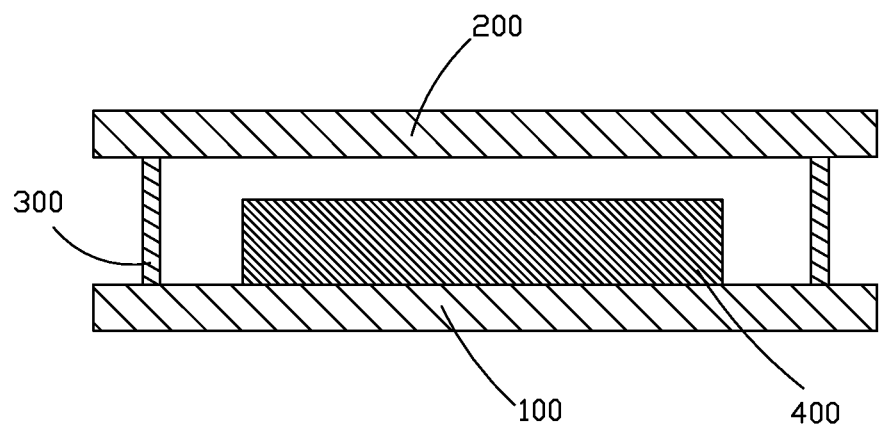
FIG. 1 is a cross-sectional view showing a conventional OLED (Organic Light-Emitting Diode) package structure.
Figure 2:
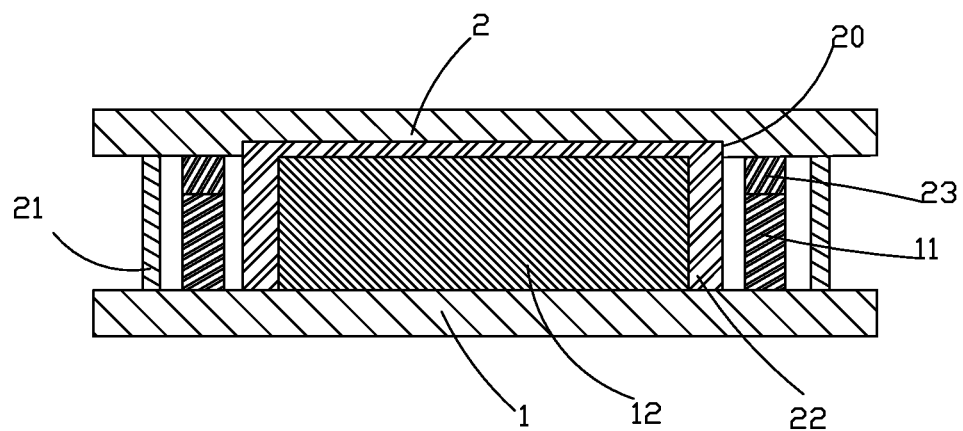
FIG. 2 is a cross-sectional view showing an OLED package structure according to the present invention.

Referring to FIG. 2, the present invention provides an organic light-emitting diode (OLED) package structure, which comprises a substrate 1, a package lid 2 opposite to the substrate 1, an OLED device 12 located between the substrate 1 and the package lid 2 and mounted on the substrate 1, a solid resin film 22 located between the substrate 1 and the package lid 2 and arranged on the package lid 2 to completely cover the OLED device 12, an inorganic protective frame 11 arranged on the substrate 1 and located outside an outer circumference of the solid resin film 22, adhesive 23 applied on the package lid 2 to bond the inorganic protective frame 11 and the package lid 2 to each other, and fritted glass 21 arranged outside an outer circumference of the inorganic protective frame 11 to bond the substrate 1 and the package lid 2 to each other.

Further, the package lid 2 comprises a trough 20 formed therein to correspond in position to the OLED device 12. The solid resin film 22 is adhesively mounted inside the trough 20 in such a way as to completely cover the OLED device 12.

The substrate 1 can be a thin-film transistor (TFT) substrate. The package lid 2 can be a glass board or a metal board and when it is a metal board, it is made of an alloy material. Preferably, the package lid 2 is a glass board.

Preferably, the inorganic protective frame 11 is made of a material comprising silicon nitride.

Specifically, the inorganic protective frame 11 has a height that is slightly smaller than a height of the fritted glass 21. The arrangement of the inorganic protective frame 11 helps strengthen air tightness of the fritted glass 21 so as to enhance the capability of blocking moisture and oxygen and also to isolate thermal radiation induced in sintering the fritted glass 21 thereby protecting a light emission element from being burned.

The adhesive 23 can be box dam glue.

In the above OLED package structure, the inorganic protective frame is arranged on an inner side of and, thus, inboard the fritted glass to effectively strengthen air tightness achieved with the fritted glass. Further, the solid resin film is arranged on the package lid to cover the OLED device so as to further strengthen the capability of blocking moisture and at the same lessen a gap in the interior of the sealed object thereby improving mechanical strength thereof and extending the lifespan and thus making it suitable to a panel of a large size.

Figure 3:
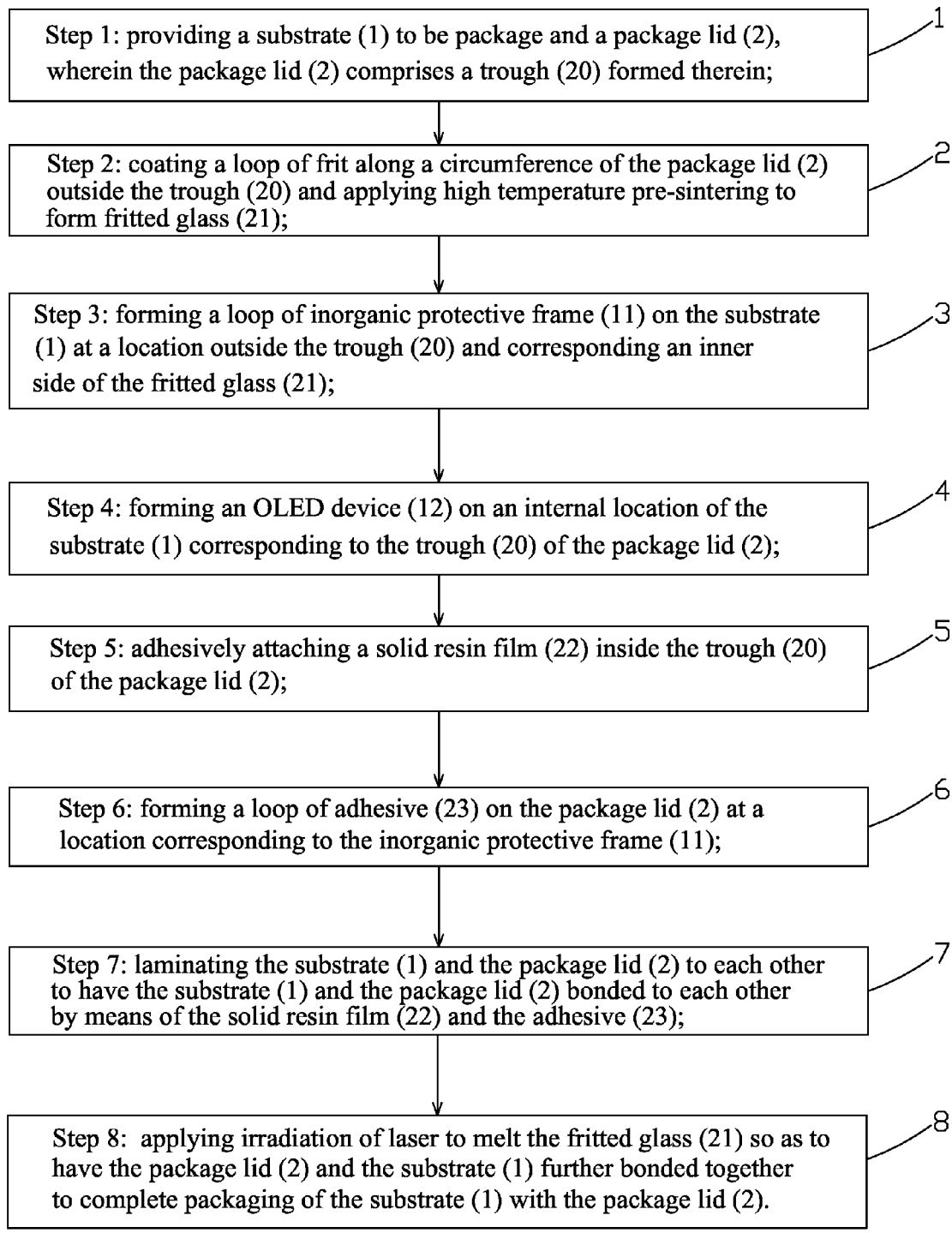
FIG. 3 is a flow chart illustrating an OLED packaging method according to the present invention.
Figure 4:
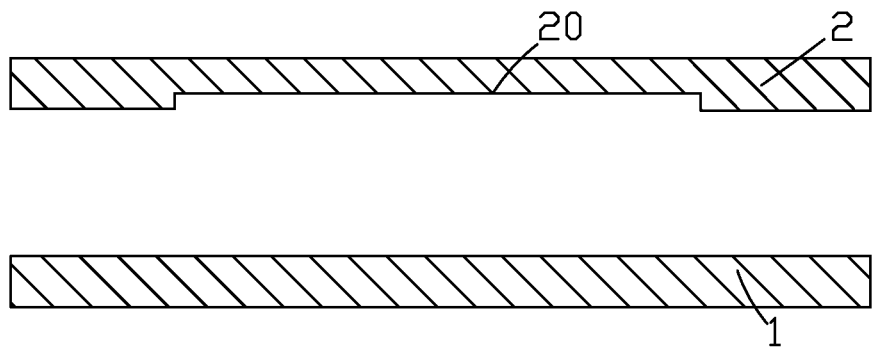
FIG. 4 is a schematic view illustrating step 1 of the OLED packaging method according to the present invention.

Referring to FIG. 3, the present invention also provides an OLED packaging method, which comprises the following steps:

Step 1: as shown in FIG. 4, providing a substrate 1 to be package and a package lid 2.

The substrate 1 can be a TFT substrate. The package lid 2 can be a glass board or a metal board and when it is a metal board, it is made of an alloy material. Preferably, the package lid 2 is a glass board.

The package lid 2 comprises a trough 20 formed therein.

Figure 5:
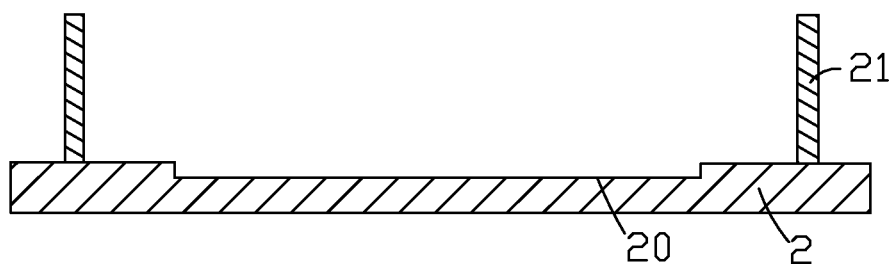
FIG. 5 is a schematic view illustrating step 2 of the OLED packaging method according to the present invention.

Step 2: as shown in FIG. 5, coating a loop of frit along a circumference of the package lid 2 outside the trough 20 and applying high temperature pre-sintering to form fritted glass 21.

Figure 6:
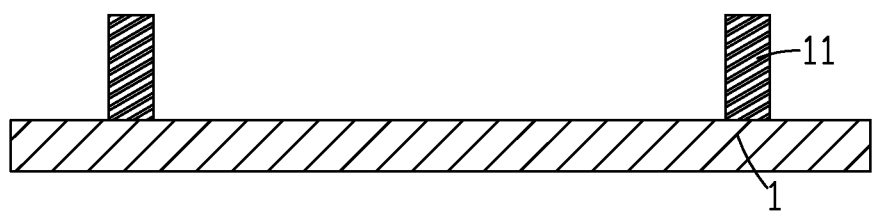
FIG. 6 is a schematic view illustrating step 3 of the OLED packaging method according to the present invention.

Step 3: as shown in FIG. 6, forming a loop of inorganic protective frame 11 on the substrate 1 at a location outside the trough 20 and corresponding an inner side of the fritted glass 21.

Specifically, the inorganic protective frame 11 is made of a material comprising silicon nitride. The inorganic protective frame 11 has a height that is slightly smaller than a height of the fritted glass 21. The arrangement of the inorganic protective frame 11 helps strengthen air tightness of the fritted glass 21 so as to enhance the capability of blocking moisture and oxygen and also to isolate thermal radiation induced in sintering the fritted glass 21 thereby protecting a light emission element from being burned.

Figure 7:
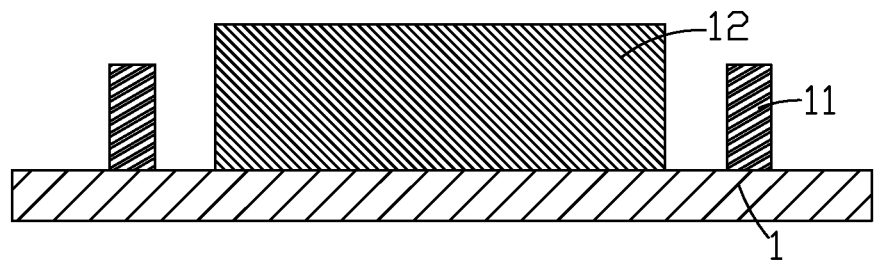
FIG. 7 is a schematic view illustrating step 4 of the OLED packaging method according to the present invention.

Step 4: as shown in FIG. 7, forming an OLED device 12 on an internal location of the substrate 1 corresponding to the trough 20 of the package lid 2.

Specifically, vapor deposition is applied to make the OLED device 12.

Figure 8:
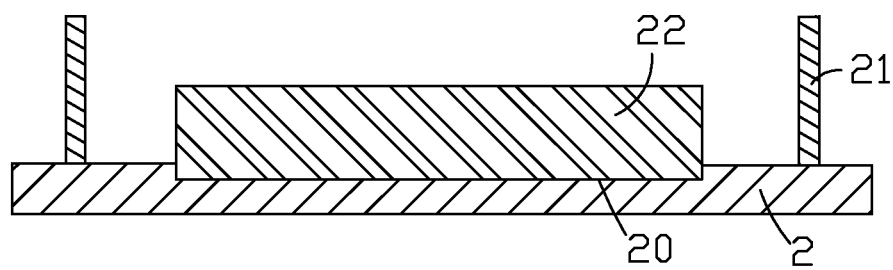
FIG. 8 is a schematic view illustrating step 5 of the OLED packaging method according to the present invention.

Step 5: as shown in FIG. 8, adhesively attaching a solid resin film 22 inside the trough 20 of the package lid 2.

Specifically, the solid resin film 22 has a surface area that is greater than a surface area of the OLED device 12 to be packaged so that when the substrate 1 and the package lid 2 are laminated to each other, the solid resin film 22 completely covers the OLED device 12. The solid resin film 22 provides resistance to moisture so as to further improve the capability of blocking moisture.

Figure 9:
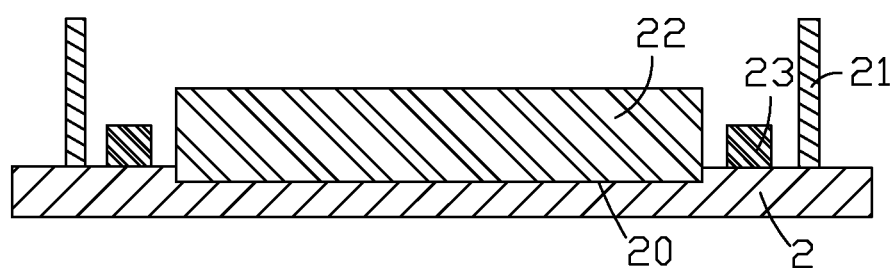
FIG. 9 is a schematic view illustrating step 6 of the OLED packaging method according to the present invention.

Step 6: as shown in FIG. 9, forming a loop of adhesive 23 on the package lid 2 at a location corresponding to the inorganic protective frame 11.

Preferably, the adhesive 23 is box dam glue.

Figure 10:
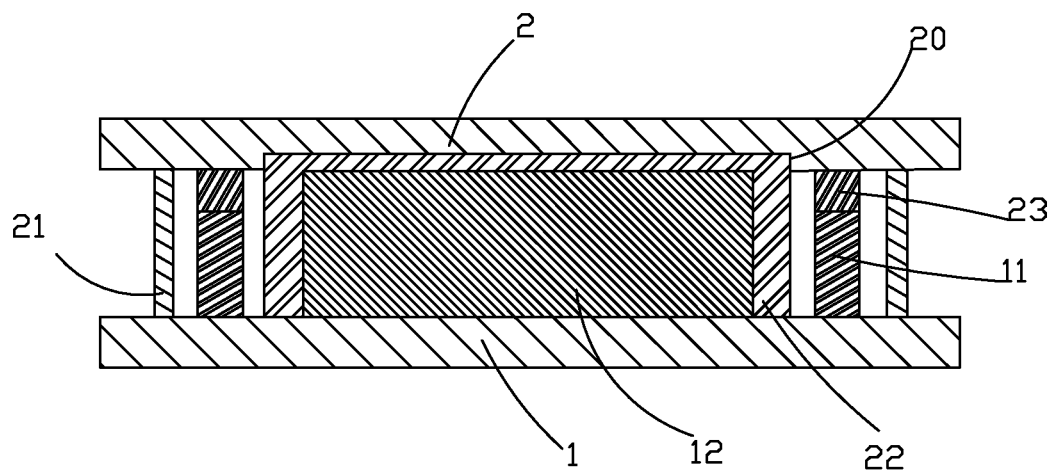
FIG. 10 is a schematic view illustrating step 7 of the OLED packaging method according to the present invention.

Step 7: as shown in FIG. 10, laminating the substrate 1 and the package lid 2 to each other to have the substrate 1 and the package lid 2 bonded to each other by means of the solid resin film 22 and the adhesive 23.

Figure 11:
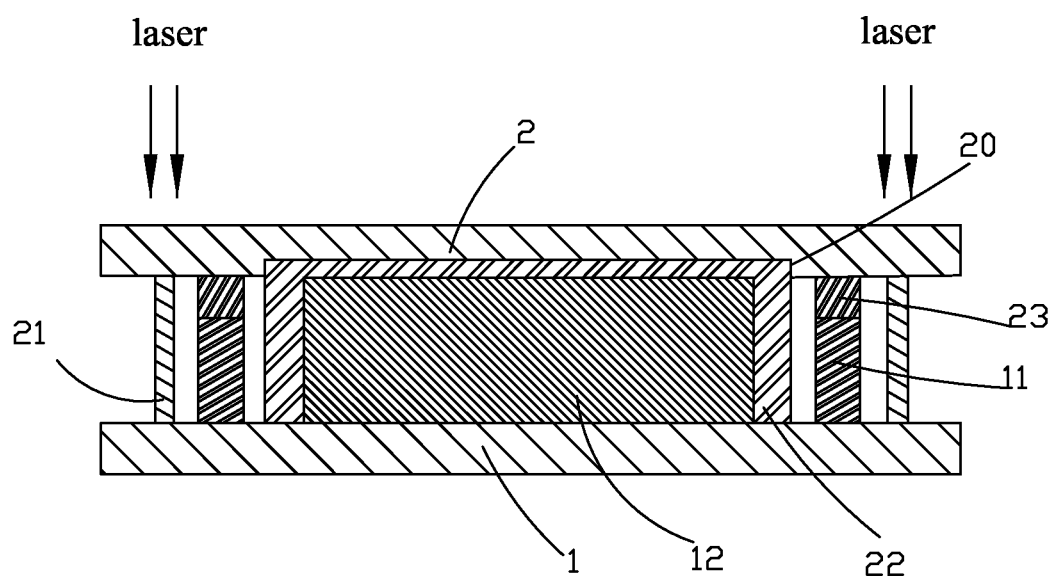
FIG. 11 is a schematic view illustrating step 8 of the OLED packaging method according to the present invention.

Step 8: as shown in FIG. 11, applying irradiation of laser to melt the fritted glass 21 so as to have the package lid 2 and the substrate 1 further bonded together to complete packaging of the substrate 1 with the package lid 2.

In the above OLED packaging method, by arranged the inorganic protective frame on an inner side of and, thus, inboard the fritted glass, air tightness achieved with the fritted glass is effectively strengthened. Further, the solid resin film is arranged on the package lid to cover the OLED device so as to further strengthen the capability of blocking moisture. Further, the inorganic protective frame helps isolate radiation heat generated in sintering the fritted glass thereby protecting a light emission element from being burned and also, a gap in the interior of the sealed object is lessened to provide a sufficient mechanical strength and thus effectively extend the lifespan of the OLED device, making it suitable for a panel of a large size and easy to carry out with improved operability.

In summary, the present invention provides an OLED package structure, which comprises an inorganic protective frame arranged inboard the fritted glass so as to effectively strengthen air tightness of the fritted glass and a solid resin film arranged on a package lid to cover an OLED device so as to further strengthen the capability of blocking moisture and at the same lessen a gap in the interior of the sealed object thereby improving mechanical strength thereof and extending the lifespan and thus making it suitable to a panel of a large size. The present invention provides an OLED packaging method, in which by arranged an inorganic protective frame on an inner side of and, thus, inboard fritted glass, air tightness achieved with the fritted glass is effectively strengthened. Further, a solid resin film is arranged on a package lid to cover an OLED device so as to further strengthen the capability of blocking moisture. Further, the inorganic protective frame helps isolate radiation heat generated in sintering the fritted glass thereby protecting a light emission element from being burned and also, a gap in the interior of the sealed object is lessened to provide a sufficient mechanical strength and thus effectively extend the lifespan of the OLED device, making it suitable for a panel of a large size and easy to carry out with improved operability.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light-emitting diode (OLED) package structure, comprising a substrate, a package lid opposite to the substrate, an OLED device located between the substrate and the package lid and mounted on the substrate, a solid resin film located between the substrate and the package lid and arranged on the package lid to completely cover the OLED device, an inorganic protective frame arranged on the substrate and located outside an outer circumference of the solid resin film, adhesive applied on the package lid to bond the inorganic protective frame and the package lid to each other, and fritted glass arranged outside an outer circumference of the inorganic protective frame to bond the substrate and the package lid to each other;

wherein the package lid comprises a trough formed therein to correspond in position to the OLED device and the trough has a projection area on the substrate that is greater than an area occupied by the OLED device on the substrate and the solid resin film is adhesively mounted inside the trough in such a way as to completely cover the OLED device;

wherein the inorganic protective frame that is located outside the outer circumference of the solid resin film is separated from the outer circumference of the solid resin film by a void space around the outer circumference of the solid resin film, and wherein the adhesive is located between an end surface of the inorganic protective frame and a surface of the package lid that faces the end surface of the inorganic protective frame such that the substrate, the inorganic protective frame, the adhesive, and the package lid are vertically stacked on each other in such an order, wherein the adhesive and the inorganic protective frame are collectively separated from the outer circumference of the solid resin film by the void space; and wherein the inorganic protective frame is made of a material comprising silicon nitride.

2. The OLED package structure as claimed in claim 1, wherein the substrate is a thin-film transistor (TFT) substrate comprising a TFT formed thereon and the package lid comprises a glass board or a metal board.

3. The OLED package structure as claimed in claim 1, wherein the adhesive is shaped as a circumferential wall circumferentially co-extensive with the end surface of the inorganic protective frame so that the inorganic protective frame and the adhesive that are vertically stacked between the substrate and the package lid form, collectively, a combined circumferential wall that surrounds and is spaced from the outer circumference of the solid resin film and is also surrounded and spaced from the fritted glass.

4. An organic light-emitting diode (OLED) package structure, comprising a substrate, a package lid opposite to the substrate, an OLED device located between the substrate and the package lid and mounted on the substrate, a solid resin film located between the substrate and the package lid and arranged on the package lid to completely cover the OLED device, an inorganic protective frame arranged on the substrate and located outside an outer circumference of the solid resin film, adhesive applied on the package lid to bond the inorganic protective frame and the package lid to each other, and fritted glass arranged outside an outer circumference of the inorganic protective frame to bond the substrate and the package lid to each other;

wherein the package lid comprises a trough formed therein to correspond in position to the OLED device and the trough has a projection area on the substrate that is greater than an area occupied by the OLED device on the substrate and the solid resin film is adhesively mounted inside the trough in such a way as to completely cover the OLED device;

wherein the inorganic protective frame that is located outside the outer circumference of the solid resin film is separated from the outer circumference of the solid resin film by a void space around the outer circumference of the solid resin film, and wherein the adhesive is located between an end surface of the inorganic protective frame and a surface of the package lid that faces the end surface of the inorganic protective frame such that the substrate, the inorganic protective frame, the adhesive, and the package lid are vertically stacked on each other in such an order, wherein the adhesive and the inorganic protective frame are collectively separated from the outer circumference of the solid resin film by the void space;

wherein the substrate is a thin-film transistor (TFT) substrate comprising a TFT formed thereon and the package lid comprises a glass board or a metal board; and wherein the inorganic protective frame is made of a material comprising silicon nitride.

5. The OLED package structure as claimed in claim 4, wherein the adhesive is shaped as a circumferential wall circumferentially co-extensive with the end surface of the inorganic protective frame so that the inorganic protective frame and the adhesive that are vertically stacked between the substrate and the package lid form, collectively, a combined circumferential wall that surrounds and is spaced from the outer circumference of the solid resin film and is also surrounded and spaced from the fritted glass.

* * * * *